(12) United States Patent
Lee

(10) Patent No.: US 7,164,608 B2
(45) Date of Patent: Jan. 16, 2007

(54) NVRAM MEMORY CELL ARCHITECTURE THAT INTEGRATES CONVENTIONAL SRAM AND FLASH CELLS

(75) Inventor: Peter Lee, Saratoga, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 52 days.

(21) Appl. No.: 11/056,901

(22) Filed: Feb. 11, 2005

(65) Prior Publication Data
US 2006/0023503 A1 Feb. 2, 2006

(51) Int. Cl.
G11C 7/10 (2006.01)

(52) U.S. Cl. ............. 365/189.05; 365/191; 365/230.08
(58) Field of Classification Search ........... 365/189.05, 365/191, 230.08, 185.08, 185.14, 185.26, 365/185.27, 185.28, 154
See application file for complete search history.

(56) References Cited

U.S. PATENT DOCUMENTS

| | | | | |
|---|---|---|---|---|
| 5,464,998 A | | 11/1995 | Hayakawa et al. ......... 257/316 |
| 5,488,579 A | | 1/1996 | Sharma et al. ............. 365/185 |
| 5,914,895 A | * | 6/1999 | Jenne ..................... 365/185.08 |
| 6,038,170 A | | 3/2000 | Shiba .................... 365/185.13 |
| 6,414,873 B1 | * | 7/2002 | Herdt .................... 365/185.08 |
| 6,781,916 B1 | * | 8/2004 | McClure ................ 365/230.03 |
| 6,965,524 B1 | * | 11/2005 | Choi .................... 365/185.08 |

* cited by examiner

Primary Examiner—Richard Elms
Assistant Examiner—Dang Nguyen
(74) Attorney, Agent, or Firm—Saile Ackerman LLC; Stephen B. Ackerman; Billy Knowler

(57) ABSTRACT

A nonvolatile SRAM array has an array of integrated nonvolatile SRAM circuits arranged in rows and columns on a substrate. Each of the integrated nonvolatile SRAM circuits includes an SRAM cell, a first and second nonvolatile memory element. The SRAM cell has a latched memory element in communication first and second nonvolatile memory elements to receive and permanently retain the digital signal from the latched memory element. A power detection circuit detects a power interruption and a power initiation and communicates the detection of the power interruption and power initiation to the plurality of integrated nonvolatile SRAM circuits. The SRAM cell, upon detection of the power interruption, transmits the digital signal to the first and second nonvolatile memory elements. The SRAM cell of each of the nonvolatile static random access memories upon detection of the power initiation, receives the digital signal from the first and second nonvolatile memory elements.

24 Claims, 9 Drawing Sheets

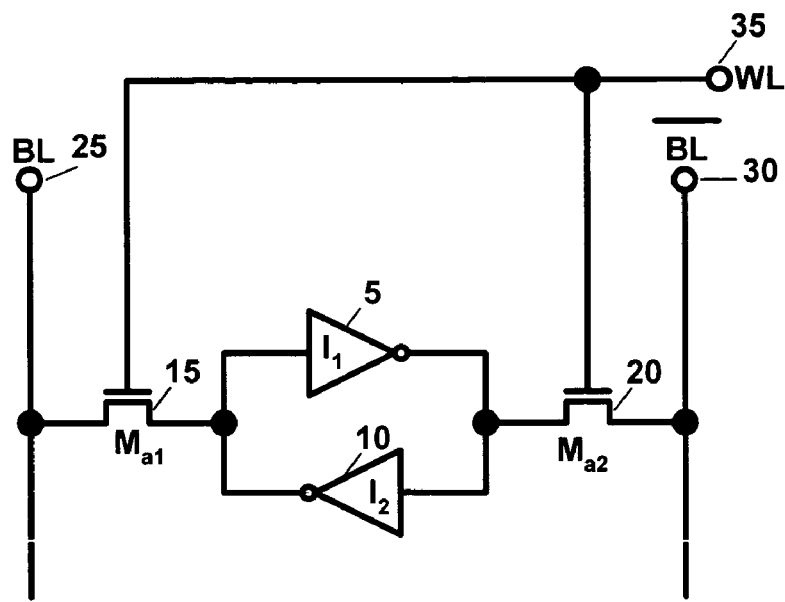
Prior Art     FIG. 1a
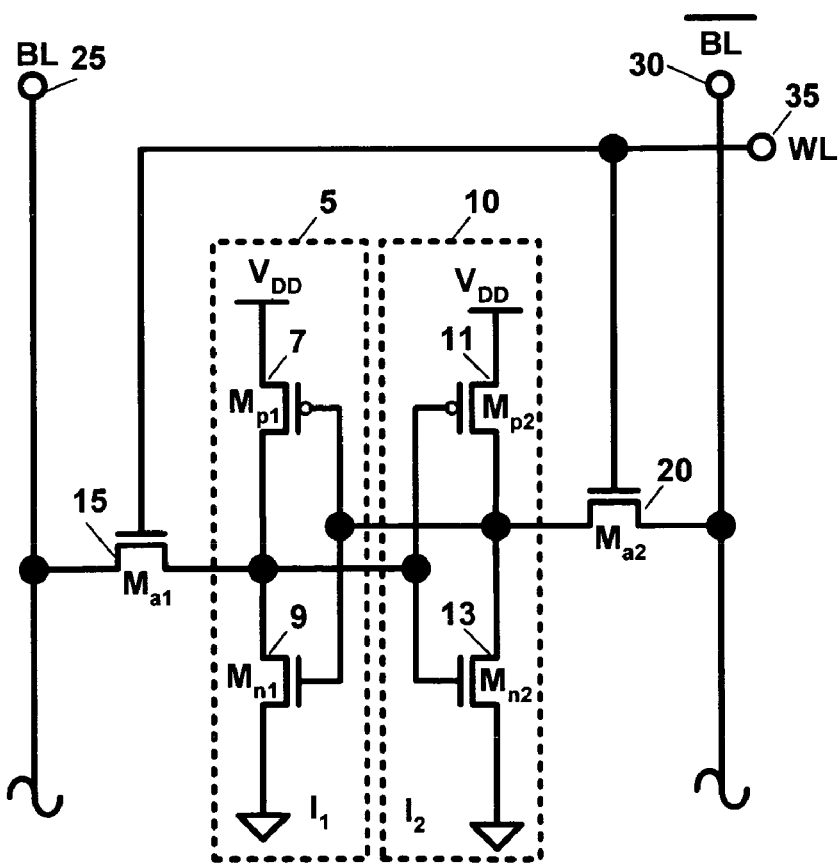
Prior Art     FIG. 1b

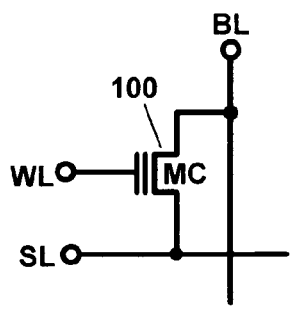
FIG. 2a
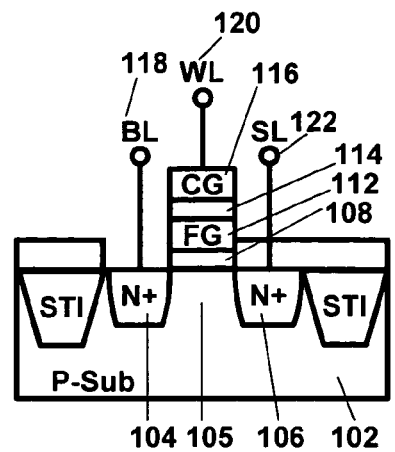
FIG. 2b
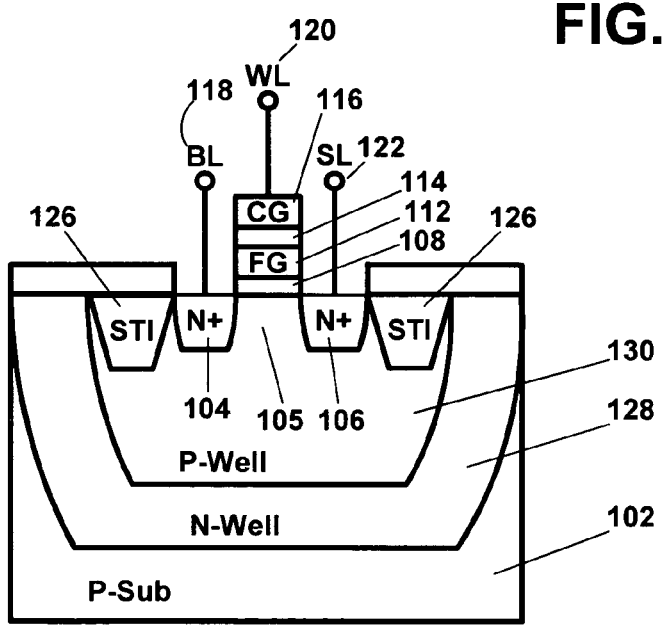
FIG. 2c
|          | Drain      | Source     | Gate   | P-sub. |
|----------|------------|------------|--------|--------|
| Erase    | 0V         | 0V         | < -18V | 0V     |
| Program1 | 0V         | 0V         | >+18V  | 0V     |
| Program2 | $V_{INH}$  | $V_{INH}$  | >+18V  | 0V     |
FIG. 2d

| Voltage | BL | SG1 | WL | SG2 | SL | Bulk | Scheme |
|---|---|---|---|---|---|---|---|
| Erase | 0 | VDD | -18V | VDD | 0 | 0 | FN (Channel) |
| Program Inhibit (selected WL) | VDD | VDD | +18V | 0 | VDD/0 | 0 | No FN |
| Program | 0 | VDD | +18V | 0 | VDD/0 | 0 | FN (Channel) |

| | BL | $\overline{BL}$ | SRAMWL | Q | $\overline{Q}$ | SG1 | SG2 | FWL | FSL |
|---|---|---|---|---|---|---|---|---|---|
| Write SRAM | VDD/0V | 0V/VDD | VDD | VDD/0V | 0V/VDD | 0V | 0V | 0V | 0V |
| Read SRAM | X | X | VDD | VDD/0V | 0V/VDD | 0V | 0V | 0V | 0V |
| Program SRAM into NVME | X | X | 0V | VDD/0V | 0V/VDD | VDD | VDD | +18V | 0V/VDD |
| Erase NVME | X | X | X | X | X | VDD | VDD | -18V | 0V |
| Program NVME into SRAM | X | X | 0V | Flash data | Flash data | VDD | VDD | VDD | VDD |

X = DON'T CARE

FIG. 5

NVRAM MEMORY CELL ARCHITECTURE THAT INTEGRATES CONVENTIONAL SRAM AND FLASH CELLS

BACKGROUND OF THE INVENTION

1. Field of the Invention

This invention relates generally to a random access memory (RAM) circuits. More particularly, this invention relates to static RAM circuits. Even more particularly, this invention relates to integrated nonvolatile static RAM (NVSRAM) circuits.

2. Description of Related Art

Static random access memory (SRAM) is well known in the art and consists of a bistable transistor flip-flop or latching circuit. Referring to FIGS. 1a and 1b, the inverters $I_1$ 5 and $I_2$ 10 are coupled such that the output of the inverter $I_1$ 5 is connected to the input of the inverter $I_2$ 10 and the output of the inverters $I_2$ 10 is connected to the input of the inverter $I_1$ 5 to form the bistable latch. The access transistor $M_{a1}$ 15 has a first source/drain terminal connected to the input of the inverter $I_1$ 5 and the output of the inverter $I_2$ 10 and a second source/drain terminal connected to the bit line BL 25. The access transistor $M_{a2}$ 20 has a first source/drain terminal connected to the input of the inverter $I_2$ 10 and the output of the inverter $I_1$ 5 and a second source/drain terminal connected to the bit line $\overline{BL}$ 30. The gates of the access transistors $M_{a1}$ 15 and $M_{a2}$ 20 are connected to the word line WL 35 to receive the activation signals for accessing the memory cell.

In operation, the bit lines BL 25 and $\overline{BL}$ 30 are precharged respectively to the data to be written or read from the memory cell. The word Line WL 35 is set to a voltage level sufficient to activate the access transistors $M_{a1}$ 15 and $M_{a2}$ 20 and the digital signal representative of the binary data to be written to or read from the memory cell is transferred to or from the memory cell.

The inverter $I_1$ 5 consists of the n-type MOS transistor $M_{n1}$ 9 and the p-type MOS transistor $M_{p1}$ 7 configured as the well known CMOS inverter. Similarly the inverter $I_2$ 10 consists of the n-type MOS transistor $M_{n2}$ 13 and the p-type MOS transistor $M_{p2}$ 11 also configured a CMOS inverter. The gates of the n-type MOS transistor $M_{n1}$ 9 and the p-type MOS transistor $M_{p1}$ 7 are connected to the common drain connection of the n-type MOS transistor $M_{n2}$ 13 and the p-type MOS transistor $M_{p2}$ 11 and the gates of the n-type MOS transistor $M_{n2}$ 13 and the p-type MOS transistor $M_{p2}$ 11 are connected to the common drain connection of the n-type MOS transistor $M_{n1}$ 9 and the p-type MOS transistor $M_{p1}$ 7. This forms the cross-connection to create the bistable flip-flop. The sources of the gates of the n-type MOS transistor $M_{n1}$ 9 and the p-type MOS transistor $M_{p1}$ 7 are connected to the common drain connection of the n-type MOS transistors $M_{n2}$ 13 and $M_{n1}$ 9 are connected to the ground reference voltage source and the sources of the p-type MOS transistors $M_{p1}$ 7 and $M_{p2}$ 11 are connected to the power supply voltage source $V_{DD}$.

As stated above, the bit lines BL 25 and $\overline{BL}$ 30 are precharged for performing desired writing and read from the SRAM cell. For instance if the digital signals representing a binary 1 are to be written to the SRAM cell, the bit line BL 25 is set to the voltage of the power supply voltage source $V_{DD}$ less a voltage threshold $V_T$ of an MOS transistor and the bit line $\overline{BL}$ 30 is set to essentially the ground voltage level. The word Line WL 35 is set to a voltage level sufficient to activate the access transistors $M_{a1}$ 15 and $M_{a2}$ 20. The digital signal representing the binary 1 turns on the n-type MOS transistor $M_{n2}$ 13 and turns off the p-type MOS transistor $M_{p2}$ 11. The complementary binary 0 present at the bit line $\overline{BL}$ 30 turns on the p-type MOS transistor $M_{p1}$ 7 and turns off the n-type MOS transistor $M_{n1}$ 9, thus setting the flip-flop For reading the SRAM cell, the bit lines BL 25 and $\overline{BL}$ 30 are precharged to a level approximately equal to one half of the voltage level of the power supply voltage source $V_{DD}$ and the word Line WL 35 is set to the voltage level sufficient to activate the access transistors $M_{a1}$ 15 and $M_{a2}$ 20. The digital signals present at the drains of the n-type MOS transistor $M_{n1}$ 9 and the p-type MOS transistor $M_{p1}$ 7 are transferred to the bit line BL 25 and the digital signals present at the n-type MOS transistor $M_{n2}$ 13 and the p-type MOS transistor $M_{p2}$ 11 is transferred to the bit line $\overline{BL}$ 30. The bit lines BL 25 and $\overline{BL}$ 30 are connected to a bit line sense amplifier to regenerate the binary data.

The data retained in the memory cell is volatile, in that any interruption of the power supply voltage source causes a loss of the data. An alternative to the volatile SRAM is the nonvolatile RAM. The nonvolatile RAM consists of a floating gate transistor which has a charge placed on a floating gate to modify the voltage threshold $V_T$ of the floating gate transistor that indicates the state of the binary data retained in the nonvolatile RAM cell. The cell structure and application of the nonvolatile RAM is well known in the art. The nonvolatile RAM has three classifications the Electrically Programmable Read Only Memory (EPROM), Erasable and Programmable Read Only Memory (EEPROM), and the flash Electrically Erasable and Programmable Read Only Memory (Flash). The EPROM is programmed by electrically forcing charge to the floating gate. Ultra-violet light is employed to eliminate (erase) the electrical charges of the programming from the floating gate of the EPROM. During EPROM program operation, in addition to a low-voltage power supply ($V_{DD}$), an external high-voltage programming power supply (VPP) of about 12V is used. With a sealed package, UV-light cannot reach floating-gate, thus the erase operation is blocked and the EPROM is considered a One Time Programmable (OTP) EPROM. If the sealed OTP is changed to sealed Flash, then both erase and program operations can be performed electrically and repeatedly in system without the overheads of UV-light exposure and the external VPP programmer due to Flash's on-chip charge pump that can generate high voltage internally.

The nonvolatile RAM or Flash memory offers a medium read speed of around 50 ns but a very slow write speed of a few milliseconds (ms). The reason for such a slow write speed in today's flash memory cells are mainly due to its slow program and erase schemes based on device FN tunneling. The FN-tunneling effect allows the electrons to be injected into or removed from flash's floating gate that is used to store the data. In order to have a successful FN tunneling effect, the electric field across the tunneling oxide has to be maintained larger than 10V/cm. That is the reason why most of the flash memory requires a charge pump to generate on-chip high-voltage for erase and program operations.

There is a need to have a random access memory that offers the same fast read and write speed as conventional SRAM in 10 nS range and while retaining the non-volatility of flash to retain its data when power loss occurs.

U.S. Pat. No. 5,488,579 (Sharma, et al.) details a non-volatile SRAM cell that includes a six-transistor SRAM cell and a three-transistor nonvolatile memory portion. The nonvolatile memory portion is connected to one storage node of the SRAM cell portion.

U.S. Pat. No. 5,464,998 (Hayakawa, et al.) provides a non-volatile semiconductor memory device that includes NAND type memory cells arranged in a matrix pattern over a semiconductor substrate and channel stopper layers. The channel stopper layers separate adjacent NAND type memory cells.

U.S. Pat. No. 6,038,170 (Shiba) describes a nonvolatile memory with a hierarchical bit line structure. Sub-bit lines within the hierarchical structure are connected to an appropriate main bit line through a first and a second selection MOS transistor. The first selection MOS transistor has a thin gate insulating film and is used for read operations only. The second MOS transistor has a thick gate insulating film and is used at least for write operations.

SUMMARY OF THE INVENTION

An object of this invention is to provide a random access memory circuit that offers the same fast read and write speed as conventional SRAM.

An object of this invention is to provide a random access memory circuit with the non-volatility of nonvolatile RAM to retain its data when power loss occurs.

Another object of the this invention is to provide a power detection and control circuit that detects power initiation to write the data stored in a nonvolatile memory element back to an SRAM cell.

Further, another object of this invention is to provide a power detection and control circuit that detects interruption of power to write the data stored in a SRAM cell back to a nonvolatile memory element.

Further still, another object to this invention is to provide a power detection and control circuit to erase nonvolatile memory elements upon successful transfer of the digital data signals to SRAM cells.

To accomplish at least one of these objects, a nonvolatile static random access memory array has an array of integrated nonvolatile static random access memory circuits arranged in rows and columns on a substrate. Each of the integrated nonvolatile random access memory circuits includes a static random access memory cell, a first nonvolatile memory element and a second nonvolatile memory element. The static random access memory cell has a latched memory element, a first access transistor, and a second access memory transistor. The latched memory element retains a digital signal indicative of a data bit. The first access transistor and the second access transistor are connected to allow control access of a first bit line and a second bit line to the latched memory element for writing and reading the digital signal to and from the latched memory element. The first and second access transistors have control gates in communication with a word line for controlling access of the latched memory element to the first and second bit lines. The first nonvolatile memory element is in communication with the latched memory element through a first terminal to receive and permanently retain the digital signal from the latched memory element and the second nonvolatile memory element is in communication with the latched memory element through a first terminal to receive and permanently retain a complementary level of the digital signal from the latched memory element.

A power detection circuit is in communication with the plurality of integrated nonvolatile static random access memory circuits to detect a power interruption and a power initiation and communicate the detection of the power interruption and detection of the power initiation to the plurality of integrated nonvolatile static random access memory circuits. The static random access memory cell of each of the nonvolatile static random access memories upon detection of the power interruption, transmits the digital signal and a complementary of the digital signal to the first and second nonvolatile memory elements. Similarly, the static random access memory cell of each of the nonvolatile static random access memories upon detection of the power initiation, receives the digital signal and a complementary of the digital signal from the first and second nonvolatile memory elements.

The first terminal of the first nonvolatile memory element of each of the plurality of integrated nonvolatile static random access memory circuits is connected between the first access transistor and the latched memory element to transfer the digital signal to the first nonvolatile memory element. Similarly, the first terminal of the second nonvolatile memory element of each of the plurality of integrated nonvolatile static random access memory circuits is connected between the second access transistor and the latched memory element to transfer the digital signal to the first nonvolatile memory element.

The first and second nonvolatile memory elements of each of the plurality of integrated nonvolatile static random access memory circuits has a first select gating transistor, floating gate transistor, and second select gating transistor serially connected. The first select gating transistor has a drain connected to the first terminal and a gate connected to receive a first select gating signal. The floating gate transistor has a drain connected to a source of the first gating transistor such that when the first select gating signal is activated the drain of the floating gate is connected to the latched memory element. A gate of the floating gate transistor is connected to receive read, program, and erase signals for the floating gate transistor. The second select gating transistor has a drain connected to a source of the floating gate transistor, a source connected to receive a source line signal for reading, programming, and erasing the floating gate transistor, and a gate to receive a second select gating signal for connecting the source line signal to the source of the floating gate transistor.

Upon detection of the power initiation, the power detection circuits sets the first select gating signal to activate the first select gating transistor, the second gating signal to activate the second gating transistor, the read signal at the floating gate transistor to read the digital data and the complementary digital data for transfer to the latched memory element.

Upon completion of the transfer of the digital data from the first and second nonvolatile memory elements to the static random access memory cell, the first and second nonvolatile memory elements of each of the plurality of integrated nonvolatile static random access memory circuits are erased setting the first gating select signal to deactivate the first select gating transistors of the first and second nonvolatile memory elements. The erase signal of from approximately −15V to approximately −22V is applied to the gate of the floating gate transistors of the first and second nonvolatile memory elements. The second gating select signal is applied to activate the select gating transistor of the first and second nonvolatile memory elements to connect the sources of the floating gate transistors of the first and second nonvolatile memory elements to the source line. The ground reference voltage is applied to the source line. The erase function is performed for all the integrated nonvolatile static random access memory circuits.

The static random access memory cell of each of the plurality of integrated nonvolatile static random access memory circuits retains the digital signal as volatile digital data by setting the first gating signal such that the first select gating transistors of the first and second nonvolatile memory elements are deactivated and the static random access memory cell is effectively not in communication with the first and second nonvolatile memory elements.

Upon detection of the interruption of power, the digital signal is read from the static random access memory cells and programmed to the first nonvolatile memory element of each of the plurality of integrated nonvolatile static random access memory circuits. Similarly, the complementary of the digital signal are read from the static random access memory cells and programmed to the second nonvolatile memory element of each of the plurality of integrated nonvolatile static random access memory circuits by setting the first gating select signal to activate the first select gating transistors of the first and second nonvolatile memory elements. The program signal from approximately +15V to approximately +22V is applied to the gate of the floating gate transistors of the first and second nonvolatile memory elements. The second gating select signal is applied to activate the select gating transistors of the first and second nonvolatile memory elements to connect the sources of the floating gate transistors of the first and second nonvolatile memory elements to the source line and the ground reference voltage is applied to the source line. The programming sequence occurs during the decay period of the power at the interruption of the power.

BRIEF DESCRIPTION OF THE DRAWINGS

FIGS. 1a and 1b are schematic diagrams of an SRAM of the prior art

FIG. 2a is a schematic diagram of a floating gate transistor of a nonvolatile memory element of this invention.

FIGS. 2b and 2c are cross sectional diagrams of a substrate into which a floating gate transistor of a nonvolatile memory element of this invention is formed.

FIG. 2d is a table illustrating the erase and program voltages of the floating gate transistor of the nonvolatile memory element of this invention.

FIG. 5 is a table of the operational voltages of a nonvolatile static random access memory circuit of this invention.

DETAILED DESCRIPTION OF THE INVENTION

Figures 3A, 3B, 3C:
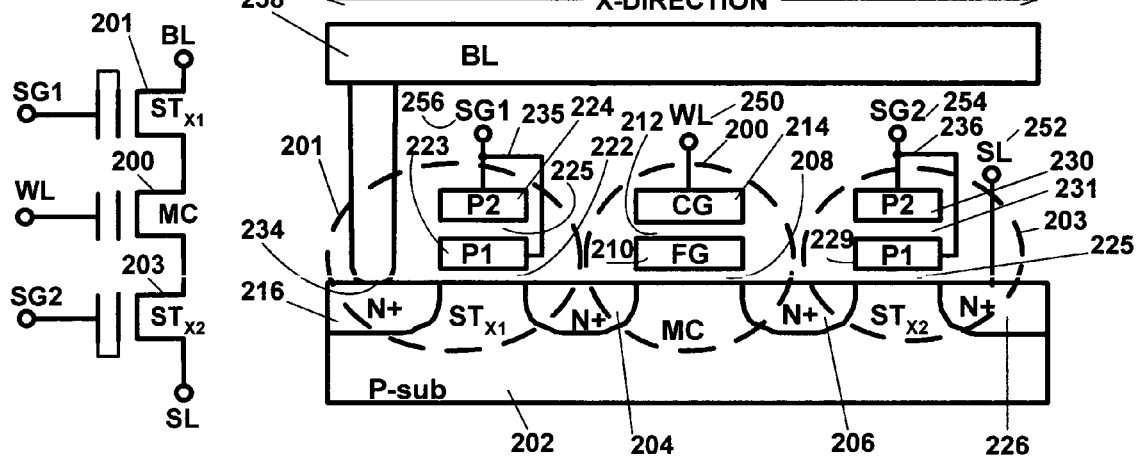
FIG. 3a is a schematic diagram of a nonvolatile memory element of this invention.
FIG. 3b is a cross sectional diagram of a substrate into which a nonvolatile memory element of this invention is formed.
FIG. 3c is a table illustrating the erase and program voltages of the nonvolatile memory element of this invention.

The Nonvolatile static random access memory (NVSRAM) circuit of this invention integrates an SRAM cell with nonvolatile memory elements. The NVSRAM circuit of this invention operates as a conventional SRAM, allowing for high-speed random read and write operations when $V_{DD}$ is turned on, but also as a flash cell that is capable of retaining the SRAM data upon interruption of the power supply voltage source $V_{DD}$. The digital data is retained permanently within the NVSRAM circuit because the digital data is written into the nonvolatile memory elements. A power supply voltage source detection and control circuit provides the appropriate control signals to write the digital data retained within the SRAM cell to the nonvolatile memory elements within a predetermined period time upon detection of an interruption in the power supply voltage source $V_{DD}$. The power supply voltage source detection and control circuit, upon detection of an initiation of the power supply voltage source, reads the last stored digital data stored in the nonvolatile memory elements and writes the digital data to the SRAM memory cell.

FIGS. 2a–c illustrate a one-transistor floating gate flash memory cell incorporated in the nonvolatile memory element of this invention. The nonvolatile memory cell 100 is formed within a p-type substrate 102. An $n^+$ drain region 104 and an $n^+$ source region 106 is formed within the p-type substrate 102, as shown in FIG. 2b. Alternately, the memory cell 100 may be formed in a triple well structure, as shown in FIG. 2c. In a triple well structure an N-type material is diffused into the substrate to form a deep N-well 128. An P-type material is then diffused into the deep N-type well 128 to form a P-type well 130. The $n^+$ drain region 104 and the $n^+$ source region 106 are formed within the P-type well 130. The triple well structure allows more isolation between different nonvolatile array types integrated on the single integrated circuit chip.

A relatively thin gate dielectric or tunneling oxide 108 is deposited on the surface of the p-type substrate 102. A poly-crystalline silicon floating gate 112 is formed on the surface of the tunneling oxide 108 above the channel region 105 between the drain region 104 and source region 106. An interpoly dielectric layer 114 is placed on the floating gate 112 to separate the floating gate 112 from a second layer of poly-crystalline silicon that forms a control gate 116.

The floating gate 112 is constrained to be aligned with the edges 110 of the drain 104 and the source 106 over the channel region 105. Further, there are no "wings" for smaller cell size or wings with larger cell size and the floating gate is constrained to the width of the drain 104 and the source 106. The coupling coefficient is thus around (~50%) for the cell structure without wings and more than 50% for cell structure with wings.

In an application, of a single transistor nonvolatile memory cell of this invention within a flash memory, the p-type substrate 102 is connected to a substrate biasing voltage, which in most instances is the ground reference potential (0V). The source region 106 is connected to a source voltage generator through the source line terminal SL 122. The control gate 116 is connected through the word line terminal WL 120 to a control gate voltage generator. And the drain region 104 is connected through the contact 124 to the bit line 118 to a bit line voltage generator.

The memory cell 100 is separated from adjacent memory cells or circuits of an integrated circuit on a substrate by the shallow trench isolation 126. The shallow trench isolation 126 provides a level isolation from disturbing signals from any operations of the adjacent cells.

To compensate for the case of lower the coupling ratio of the control gate 116 and floating gate 112, the magnitude of voltage applied to control gate has to be increased to maintain the same tunneling electrical field across the same thickness of tunneling oxide 108 to cause the flow of charge to or from the floating gate 112.

The single transistor flash memory cell of this invention is erased, as shown in the table of FIG. 3c, by setting word line generator and thus control gate 116 through the word line WL 120 to a relatively large negative erase voltage of from approximately −15.0 to approximately −22.0V, preferably −18.0V. The bit line voltage generator and thus the bit line BL 118 and the source line generator and thus the source SL 122 is connected such that the drain 104 and the source 106 are connected to the ground reference voltage. Under these conditions there is a large electric field developed across the tunneling oxide 108 in the channel region 105. This field causes the electrons trapped in the floating gate 112 to flow to channel region 105 by the Fowler-Nordheim tunneling.

The memory cell 100 is programmed (Program 1) as shown in the table of FIG. 2d by applying a relatively high positive programming voltage (on the order of from approximately +15.0 to approximately +22.0V) to the control gate 116 through the word line WL 120. The bit line voltage generator and the source line voltage generator are set to the ground reference potential (0V) to respectively set the bit line BL 118 and thus the drain 104 and the source line SL 122 and the thus the source 106 to the ground reference potential. With these voltages setup, an electric field will be produced at tunnel oxide layer of 108 between the channel 105 and floating gate 112. The electrons in channel region of 105 of the p-type substrate 102 will have sufficient energy to be accelerated across the tunneling oxide 108 and trapped on the floating gate 112. The trapped electrons will cause the threshold voltage of the field effect transistor (FET) that is formed by the memory cell 100 to be increased by three to five volts. This increase in threshold voltage by the trapped hot electrons causes the cell to be programmed from the un-programmed state of a logical one (1) to a logical zero (0).

To prevent a non-selected memory cell 100 from being programmed (Program2) by setting the relatively high positive programming voltage (on the order of from approximately +15.0 to approximately +22.0V, preferably +18V) to the control gate 116 through the word line WL 120. The bit line voltage generator and the source line voltage generator are set to the ground reference potential (0V) to respectively set the bit line BL 118 and thus the drain 104 and the source line SL 122 and the thus the source 106 to an inhibit voltage $V_{INH}$. The inhibit voltage $V_{INH}$ is from approximately 6.0 to approximately 11.0V, preferably +9.0V.

FIGS. 3a and 3b illustrate the nonvolatile memory element of the NVSRAM of this invention. The nonvolatile memory element consists of a stacked gate or floating gate transistor 200, a first select gating transistor 201, and a second select gating transistor 203 formed on a p-type substrate 202. An $n^+$ drain region 204 and an $n^+$ source region 206 is formed within the p-type substrate 202.

A relatively thin tunneling oxide 208 is deposited on the surface of the p-type substrate 202. A poly-crystalline silicon floating gate 210 is formed on the surface of the tunneling oxide 208 above the channel region between the drain region 204 and source region 206. An interpoly dielectric layer 212 is placed on the floating gate 210 to separate the floating gate 210 from a second layer of poly-crystalline silicon that forms a control gate 214.

The drain 204 fundamentally is the source of the first select gating transistor 201. The drain 216 of the first select gating transistor 201 is connected through the contact 234 to the bit line 258. The first gate 223 of the first select gating transistor 201 is placed over the gate oxide 222 between the drain 204 of the memory cell 200 and the drain 216 of the select transistor 201. The interpoly dielectric layer 225 is formed over the first gate 223, with a second gate 224 having equivalent structure to the control gate 214 formed over the interpoly dielectric layer 225.

The first and second gates 223 and 224 are connected separately through wiring traces 235 to a location near the end of the word line 250. The wiring traces 235 are connected to the select control line 256, which conducts a select signal to the first and second gates 223 and 224 of the first select gating transistor 201 to control the impact of the over-erasure of the memory cell.

The source 206 fundamentally is the drain of the second select gating transistor 203. The source 226 of the second select gating transistor 203 is connected to the source line 252. The first gate 229 of the second select gating transistor 203 is placed over the gate oxide 228 between the drain 204 of the memory cell 200 and the drain 216 of the second select gating transistor 203. The interpoly dielectric layer 231 is formed over the first gate 229, with a second gate 230 having equivalent structure to the control gate 214 formed over the interpoly dielectric layer 231. The first and second gates 229 and 230 are connected separately through wiring traces 236 to a location near the end of the word line 250. The wiring traces 236 are connected to the select control line, which conducts a second select signal SG2 254 to the second select gating transistor 203 to similarly control the impact of the over-erasure of the memory cell 200.

In most applications of an EEPROM or flash memory having the three transistor configuration, the p-type substrate 202 is connected to a substrate biasing voltage, which in most instances this is the ground reference potential (0V). The drain region 216 of the first select gating transistor 201 is connected to a bit line voltage generator through the contact 234 and the bit line terminal 258. The control gate 214 is connected through the word line terminal 250 to the word line voltage generator. The first select gating line 256 is connected to a select signal generator to provide a first select signal to the gate 224 of the first select gating transistor 201. The second select gating line 254 is connected to a select signal generator to provide a second select signal to the gate 230 of the second select gating transistor 203. And the source region 226 of the second select gating transistor 203 is connected to the source line 252 to a source line voltage generator.

In order to make a compact cell size and array, both the select gating transistors 201 and 203 are preferably made of same pitch in X-direction and structure as stacked gate or floating gate transistor of FIGS. 2a–c. The second level polycrystalline silicon (poly-2) gates 224 and 230 of the first and second select gating transistors 201 and 203 are tied to first level polycrystalline silicon (poly1) gate select lines 223 and 231 to turn the first and second select gating transistors 201 and 203 device into non-floating gate poly1 NMOS devices.

The erase and program conditions of 3-transistor nonvolatile memory element of the NVSRAM of the present invention are listed in table of FIG. 3c. To erase the nonvolatile memory element, the bit line generator sets the bit line 258 and thus the drain 216 of the first select gating transistor 201 to the ground reference level. The select gating generator sets the first select gating line 256 and thus the gate 224 of the first select gating transistor 201 to the power supply voltage $V_{DD}$. The word line voltage generator sets the word line 250 and thus the control gate 214 of the memory cell 200 to the large negative erasing voltage of from approximately −15.0 to approximately −22.0V, preferably −18.0V. The select gating generator sets the second select gating line 254 and thus the gate 230 of the second select gating transistor 203 to the power supply voltage $V_{DD}$. The source line voltage generator sets the source line 252 and thus the source 226 of the second gating transistor 203 is set to the ground reference voltage. The bulk of the nonvolatile memory element is set to the ground reference voltage. The erase process is the low-current Fowler Nordheim tunneling process to the tunnel oxide 225 between the floating gate 229 and the P-type substrate 202.

The programming of the nonvolatile memory element has the bit line voltage generator setting the selected bit line 258 and thus the drain 216 of the first select gating transistor 201 to a ground reference voltage. The select gating generator sets the first select gating line 256 and thus gate 224 of the first select gating transistor 201 to the power supply voltage $V_{DD}$. The word line voltage generator sets the word line 250 and thus the control gate 214 of the memory cell 200 to a large positive programming voltage of from approximately +15.0 to approximately +22.0V, preferably +18.0V. The source line voltage generator sets the source line 252 and thus the source 226 of the second select gating transistor 203 is set to the ground reference voltage to prevent bit line leakage. The bulk of the nonvolatile memory element is set to the ground reference voltage. The programming process is the low-current Fowler Nordheim tunneling process to the channel between the source 206 and the drain 204.

To prevent or inhibit programming of nonvolatile memory element of the NVSRAM of this invention on the selected word line 250, the bit line generator sets the bit line 258 and thus the drain 216 of the first select gating transistor 201 to the power supply voltage source $V_{DD}$. The select gating generator sets the select gating line 254 and thus gate 224 of the first select gating transistor 201 to the power supply voltage source $V_{DD}$. The word line voltage generator sets the word line 250 and thus the control gate 214 of the memory cell 200 to the large positive programming voltage of from approximately −15.0 to approximately−22.0V, preferably −18.0V. The select gating generator sets the second select gating line 254 and thus the gate 230 of the second select gating transistor 203 to the ground reference voltage level to deactivate the second select gating transistor 203. The source line voltage generator sets the source line 252 may be set to either the power supply voltage level $V_{DD}$ or the ground reference voltage level to inhibit programming of the selected nonvolatile memory element.

Figure 4:
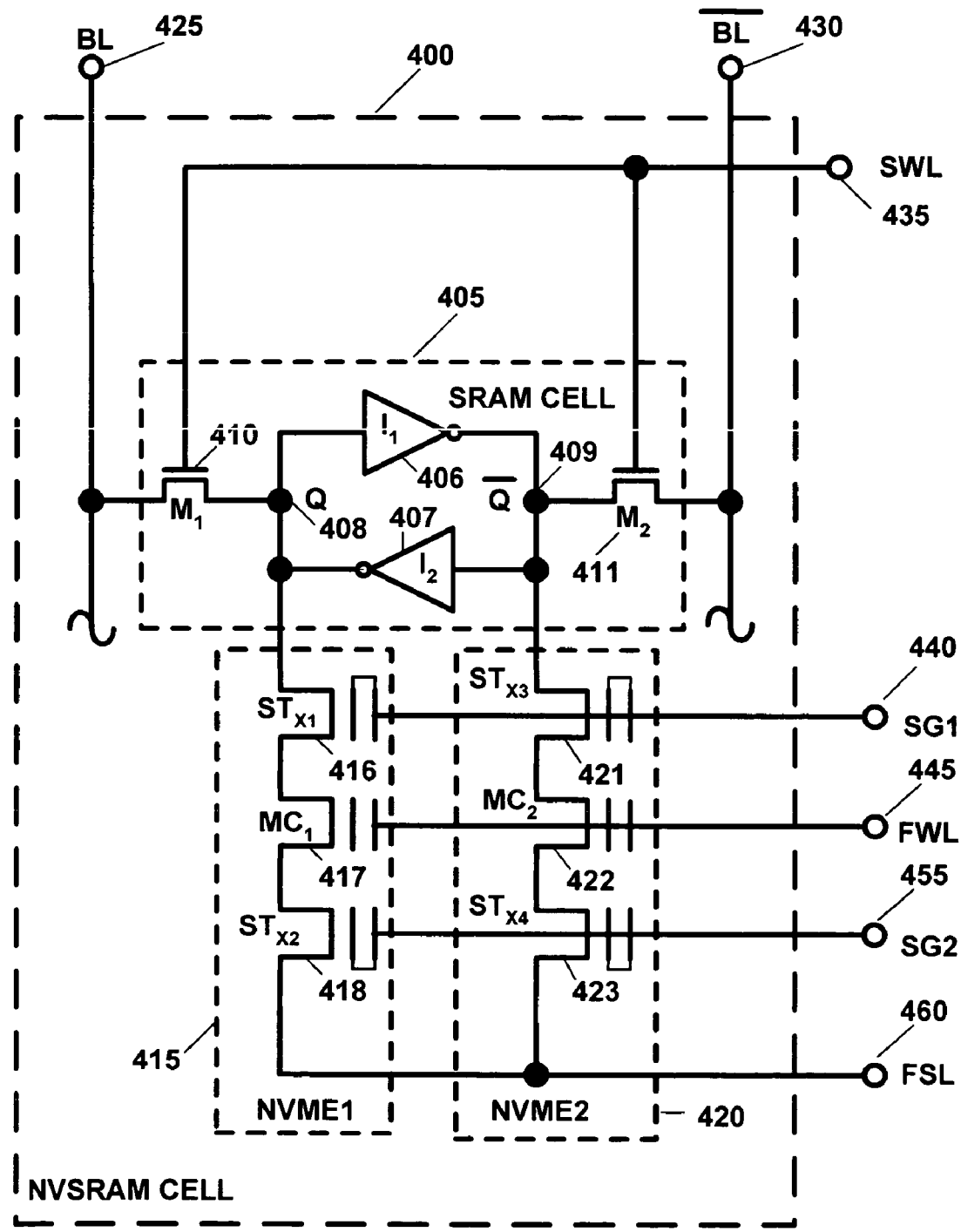
FIG. 4 is a schematic diagram of a nonvolatile static random access memory circuit of this invention.

Refer now to FIG. 4 for a discussion of the preferred embodiment of the NVSRAM cell of this invention. The NVSRAM cell 400 consists of a six transistor SRAM cell 405 and two nonvolatile memory elements 415 and 420. The SRAM cell 405 is essentially identical to the SRAM cell of the prior art as described in FIG. 1. The inverters $I_1$ 406 and $I_2$ 407 are coupled such that the output of the inverter $I_1$ 406 is connected to the input of the inverter $I_2$ 407 and the output of the inverters $I_2$ 407 is connected to the input of the inverter $I_1$ 406 to form the bistable latch. The access transistor $M_1$ 410 has a first source/drain terminal connected to the storage node Q 408 that is formed by the junction of the input of the inverter $I_1$ 406 and the output of the inverter $I_2$ 407 and a second source/drain terminal connected to the bit line BL 425. The access transistor $M_2$ 411 has a first source/drain terminal connected to the complementary storage node $\overline{Q}$ 409 that is formed by the input of the inverter $I_2$ 407 and the output of the inverter $I_1$ 406 and a second source/drain terminal connected to the bit line $\overline{BL}$ 430. The gates of the access transistors $M_1$ 410 and $M_2$ 411 are connected to the word line SWL 435 to receive the activation signals for accessing the SRAM cell 405.

The inverters $I_1$ 406 and $I_2$ 407 each consist of an n-type MOS transistors and an p-type MOS transistor configured as the well known CMOS inverter. The gates of the n-type MOS transistor and the p-type MOS transistor of the inverters $I_1$ 406 are connected to the common drain connection of the n-type MOS transistor and the p-type MOS transistor inverter $I_2$ 407 and the gates of the n-type MOS transistor and the p-type MOS transistor inverter $I_2$ 407 are connected to the common drain connection of the n-type MOS transistor and the p-type MOS transistor inverter $I_1$ 406. This forms the cross-connection to create the bistable flip-flop with the common drain connection of the n-type MOS transistor and the p-type MOS transistor inverter $I_2$ 407 being the storage node Q 408 and the common drain connection of the n-type MOS transistor and the p-type MOS transistor inverter $I_1$ 406 being the complementary storage node $\overline{Q}$ 409.

The nonvolatile memory elements 415 and 420 are structured and function as described in FIGS. 3a and 3b. Each of the nonvolatile memory elements 415 and 420 have a floating gate transistor ($MC_1$ 417 and $MC_2$ 422 respectively) and a first gating transistor $ST_{x1}$ 416 and $ST_{x3}$ 421 and a second gating transistor $ST_{x2}$ 418 and $ST_{x4}$ 423. The drain of the first gating transistor $ST_{x1}$ 416 is connected to the storage node Q 408 of the SRAM cell 405 and the drain of the second gating transistor $ST_{x3}$ 421 is connected to the complementary storage node $\overline{Q}$ 409. The sources of the first gating transistors $ST_{x1}$ 416 and $ST_{x3}$ 421 are connected respectively to the drains of the floating gate transistors $MC_1$ 417 and $MC_2$ 422. The drains of the second gating transistors $ST_{x2}$ 418 and $ST_{x4}$ 423 are respectively connected to the sources of the floating gate transistors $MC_1$ 417 and $MC_2$ 422. The sources of the second gating transistors $ST_{x2}$ 418 and $ST_{x4}$ 423 are connected to the floating gate source line FSL 460. The gates of the first gating transistors $ST_{x1}$ 416 and $ST_{x3}$ 421 are commonly connected to the first gating signal terminal SG1 440 and the gates of the second gating transistors $ST_{x2}$ 418 and $ST_{x4}$ 423 are connected to the second gating signal terminal SG2 455. The control gates of the floating gate transistors $MC_1$ 417 and $MC_2$ 422 are commonly connected to the floating gate word line FWL 445.

Refer now to the table of FIG. 5 for a discussion of the NVSRAM 400 of FIG. 4. In write operation of the SRAM cell 405, the bit line BL 425 is precharged to the voltage levels ($V_{DD}$/0V) of the digital signals representing the binary data to be stored retained by the SRAM cell 405 and the complementary bit line $\overline{BL}$ 430 is precharged to the voltage levels (0V/$V_{DD}$) of the digital signals representing the complementary binary data to be stored retained by the SRAM cell 405. The SRAM word line SWL 435 is set to the level of the power supply voltage source $V_{DD}$ to activate the access transistors $M_1$ 410 and $M_2$ 411. The voltage levels of the digital signals of the bit line BL 425 and the complementary bit line $\overline{BL}$ 430 are transferred to the storage node Q 408 and the complementary storage node $\overline{Q}$ 409. The first and second gating signal terminals SG1 and SG2, the floating gate word line FWL 445 and the floating gate source line FSL 460 are all set to the ground reference voltage level to deactivate the nonvolatile memory elements NVME1 415 and NVME2 420.

In read operation of the SRAM cell 405, the bit line BL 425 and BL 430 are precharged or equalized to the voltage levels of to the voltage level of one half of the power supply voltage source ($V_{DD}/2$) necessary to sense the digital signals representing the binary data to be stored retained by the SRAM cell 405. The SRAM word line SWL 435 is set to the level of the power supply voltage source $V_{DD}$ to activate the access transistors $M_1$ 410 and $M_2$ 411. The voltage levels of the digital signals of the storage node Q 408 and the complementary storage node $\overline{Q}$ 409 are respectively transferred to the bit line BL 425 and the complementary bit line $\overline{BL}$ 430 to be sensed by a sense amplifier attached to the bit line BL 425 and the complementary bit line $\overline{BL}$ 430. The first and second gating signal terminals SG1 and SG2, the floating gate word line FWL 445 and the floating gate source line FSL 460 are all set to the ground reference voltage level to deactivate the nonvolatile memory elements NVME1 415 and NVME2 420.

When the digital signals representing the binary data is to be transferred from the SRAM cell 405 nonvolatile memory elements 415 and 420, the SRAM word line SWL 435 is set to the ground reference voltage level deactivating the access transistors $M_1$ 410 and $M_2$ 411. With the access transistors $M_1$ 410 and $M_2$ 411 deactivated, the voltage levels of the bit line BL 425 and the complementary bit line $\overline{BL}$ 430 do not affect the NVSRAM 400 and may be at any voltage level or "don't care". The voltage levels of the digital signals of the storage nod Q 408 and the complementary storage node $\overline{Q}$ 409 are at the voltage levels of the digital signals representing the binary data retained by the SRAM cell 405 that are to be transferred to the nonvolatile memory elements 415 and 420. The voltage level of the first gating signal terminal SGI 256 is set to the voltage level of the power supply voltage source to activate first gating transistors $ST_{x1}$ 416 and $ST_{x3}$ 421 and the second gating signal terminal SG2 254 is set to the ground reference level to deactivate the second gating transistors $ST_{x2}$ 418 and $ST_{x4}$ 423 to prevent leakage to floating gate source line FSL 460. With first gating signal terminal SG1 256 at the voltage level of the power supply voltage source $V_{DD}$ and the second gating signals terminal SG2 254 at ground reference voltage level, then the floating gate word line FWL 445 and thus the control gates of the floating gate transistors $MC_1$ 417 and $MC_2$ 422 is switched to to the relatively high positive programming voltage of from approximately +15.0 to approximately +22.0V, preferably +18V to program the floating gate transistors $MC_1$ 417 and $MC_2$ 422. The floating gate source line FSL 460 is set to the $V_{DD}$ or ground reference voltage level. During the operation of writing SRAM data into nonvolatile memory element 415, the threshold voltage Vt of the floating gate transistor $MC_1$ 417 will be increased if voltage present at the storage node Q 408 is set to the ground reference voltage level. By contrast, the threshold Vt of the floating gate transistor $MC_2$ 422 will not be increased if voltage at the complementary storage node $\overline{Q}$ 409 is at the voltage level of the power supply voltage source VDD. A voltage level equal to the power supply voltage source $V_{DD}$ will generate the program inhibit voltage in channel region of the floating gate transistor $MC_2$ 422. The voltage levels of the digital signals present at the storage node Q 408 and the complementary storage node $\overline{Q}$ 409 are transferred to the floating gate transistors $MC_1$ 417 and $MC_2$ 422. Similarly, if the voltage level of the storage node Q 408 is set at the level of the power supply voltage source $V_{DD}$ and complementary storage node $\overline{Q}$ 409 is set to the ground reference voltage level, then the threshold voltage $V_t$ of the floating gate transistor MC1 417 will not be increased and the threshold voltage $V_t$ of the the floating gate transistor MC2 422 will be increased after program operation.

Erasure of the nonvolatile memory elements $MC_1$ 417 and $MC_2$ 422 is accomplished by setting first gating signal terminals SG1 to the ground reference voltage level to deactivate the first gating transistors $ST_{x1}$ 416 and $ST_{x3}$ 421. The second gating signal terminal SG2 455 are set to the power supply voltage source $V_{DD}$ to activate the second gating transistors $ST_{x2}$ 418 and $ST_{x4}$ 423. The FSL is coupled to ground level voltage. The floating gate word line FWL 445 and thus the control gates of the floating gate transistors $MC_1$ 417 and $MC_2$ 422 are set to the relatively high negative erase voltage of from approximately −15.0V to approximately −22.0V, preferably −18V to erase the floating gate transistors $MC_1$ 417 and $MC_2$ 422. With the first gating transistors $ST_{x1}$ 416 and $ST_{x3}$ 421 deactivated, the state of the terminals and the storage node Q 408 and the complementary storage node $\overline{Q}$ 409 are does not effect the operation of the nonvolatile memory elements 415 and 420 and are considered "don't care". After erase operation, both cell's Vt of MC1 and MC2 become negative and are around −2.0V after a pre-determined time of 2 mS.

Transfer of the digital signals representing the binary data is transferred from the nonvolatile memory elements 415 and 420 to the SRAM cell 405 by first setting the SRAM word line SWL 435 to the ground reference voltage level to deactivate the access transistors $M_1$ 410 and $M_2$ 411 to isolate the bit line BL 425 and the complementary bit line $\overline{BL}$ 430 from the SRAM cell 405. The first and second gating signal terminals SG1 440 and SG2 455 are set to the power supply voltage source are set to activate the first gating transistors $ST_{x1}$ 416 and $ST_{x3}$ 421 and the second gating transistors $ST_{x2}$ 418 and $ST_{x4}$ 423. The floating gate word line FWL 445 and the floating gate source line FSL 460 are set to the power supply voltage source $V_{DD}$ to activate the floating gate transistors $MC_1$ 417 and $MC_2$ 422. The digital signals retained by the nonvolatile memory elements $MC_1$ 417 and $MC_2$ 422 are transferred to the storage node Q 408 and the complementary storage node $\overline{Q}$ 409.

Figure 6:
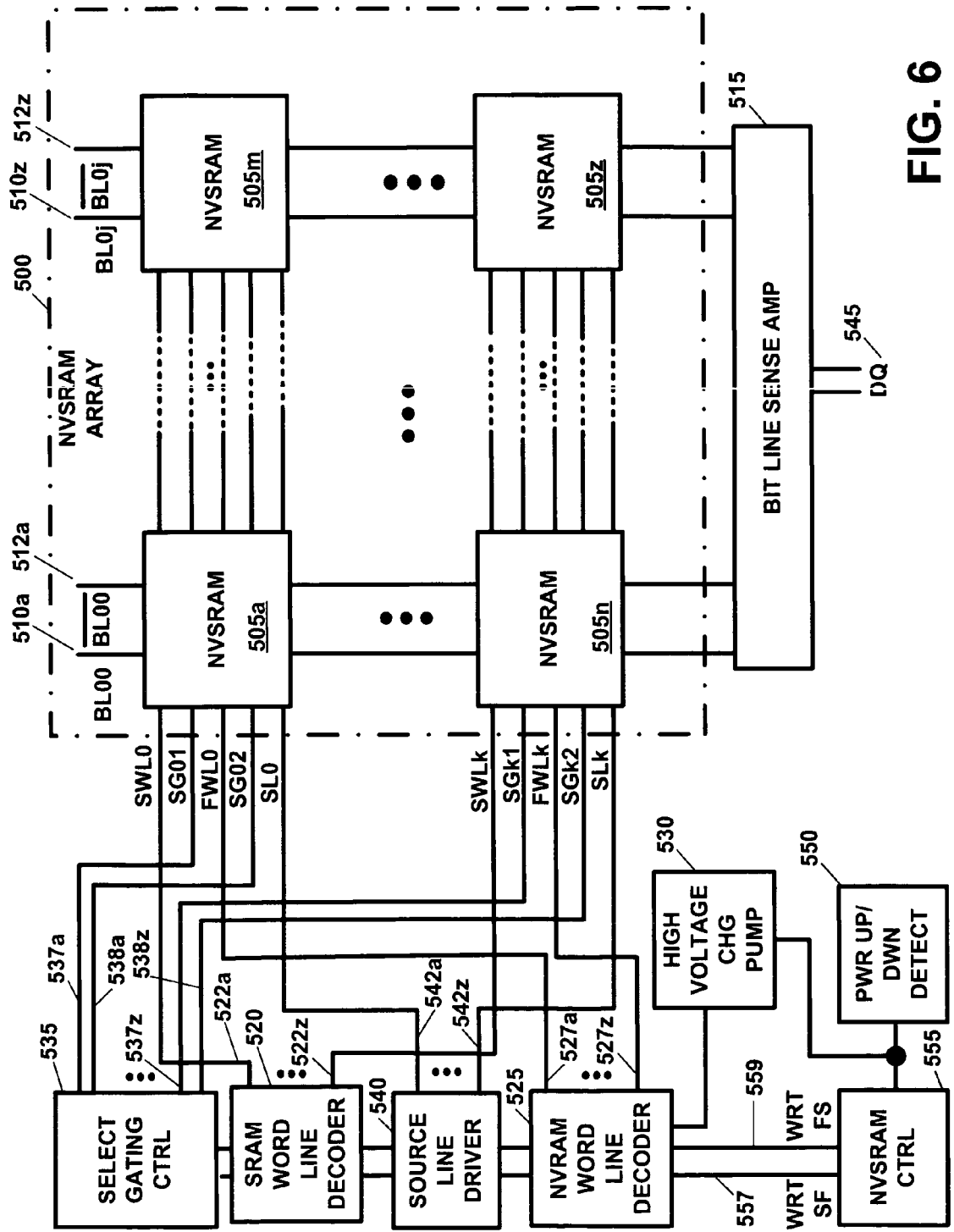
FIG. 6 is a block diagram of a nonvolatile static random access memory array of this invention.

Multiple nonvolatile SRAM's of this invention as described in FIG. 4 are arranged to form an array of nonvolatile SRAM's as shown in FIG. 6. The array 500 of NVSRAM's has multiple NVSRAM's 505*a*, . . . , 505*m*, 505*n*, . . . , 505*z* arranged in rows and columns. Each column of the array of NVSRAM's 505*a*, . . . , 505*m*, 505*n*, . . . , 505*z* is connected to a bit line BL 510*a*, . . . , 510*z* and the complementary bit line $\overline{BL}$ 512*a*, . . . , 512*z*. The bit line BL 510*a*, . . . , 510*z* and the complementary bit line $\overline{BL}$ 512*a*, . . . , 512*z* are connected to the bit line sense amplifier 515 to provide the interconnections for writing and reading the digital signals representing the binary data to and from the SRAM cells of the NVSRAM's 505*a*, . . . , 505*m*, 505*n*, . . . , 505*z*. The digital signals representing the binary data are transferred from the input/output terminals DQ 545.

The SRAM word line decoder 520 receives an address (not shown) from an external source, decodes the address, and activates the SRAM word lines SWL0 522*a*, . . . SWLk 522*z* to turn on the access transistors $Ma_1$ 410 and $Ma_2$ 411 to write or read the SRAM cells of the NVSRAM's 505*a*, . . . , 505*m*, 505*n*, . . . , 505*z*. The nonvolatile memory elements of the NVSRAM's 505*a*, . . . , 505*m*, 505*n*, . . . , 505*z* are deactivated as described above.

The select gating control circuit 535 is connected through the first and second gating signal lines SG01 537*a*, . . . , SGk1 537*z* and SG02 538*a*, ..., SGk2 538*z* to the first and second select gating transistors of the nonvolatile memory elements of the NVSRAM's 505*a*, ..., 505*m*, 505*n*, ..., 505*z* to activate and deactivate the first and second select gating transistors. The source line driver circuit 540 is connected through the floating gate source lines SL0 542*a*, ..., SLk 542*z* to the sources of the second select gating transistors of the nonvolatile memory elements of the NVSRAM's 505*a*, ..., 505*m*, 505*n*, ..., 505*z* to provide the source line voltage for the floating gate transistors of the nonvolatile memory elements of the NVSRAM's 505*a*, ..., 505*m*, 505*n*, ..., 505*z*. The NVRAM word line decoder is connected through the floating gate word lines FWL0 527*a*, ..., FWLk 527*z* for reading, programming, and erasing the floating gate transistors. The high voltage charge pump 530 provides the relatively large positive voltage of from approximately +15V to approximately +22V (preferably +18V) and the relatively large negative voltage of from approximately −15V to approximately −22V (preferably −18V) to the NVRAM word line decoder for distribution to the floating gate transistors of the nonvolatile memory elements of the NVSRAM's 505*a*, ..., 505*m*, 505*n*, ..., 505*z* for programming and erasing the digital signals from the floating gate transistors.

A power up/down detection circuit 550 monitors the power supply voltage source $V_{DD}$ applied to the array 500 of NVSRAM's 505*a*, ..., 505*m*, 505*n*, ..., 505*z* for initiation and interruption. The power up/down circuit 550 transfers a power supply state signal to the NVSRAM control circuit 555. Upon detection of an initiation or interruption of the power supply voltage source $V_{DD}$, the NVSRAM control circuit 555 activates the write nonvolatile element to SRAM control line 559 or the write SRAM to nonvolatile element control line 557. The write nonvolatile element to SRAM control line 559 and the write SRAM to nonvolatile element control line 557 are connected to the NVRAM word line decoder 525 and the high voltage charge pump 530 to control the reading, programming, and erasing of the nonvolatile memory elements of the NVSRAM's 505*a*, ..., 505*m*, 505*n*, ..., 505*z*.

During initiation of the power supply voltage source $V_{DD}$, the power supply voltage source $V_{DD}$ will sweep from ground to the operational voltage level of the power supply voltage source $V_{DD}$. Assuming that this operational voltage level is 3.0V, then the operational voltage level will ramp from 0V to 3.0V in a short of period of time. For a regular memory, this ramp up time is not clearly defined. However, for the NVSRAM memory array 500, a minimum ramp rate of the operational voltage of the power supply voltage source $V_{DD}$ is required in order to achieve data writing from flash to SRAM. The ramp rate is typically defined to be slower than 0.1V per 100 μS. For a successful writing, a ramp time of over 300 μS of voltage level of the power supply voltage source $V_{DD}$ is required. The power up/down detection circuit 550 generates the power supply state signal to the NVSRAM control circuit 555. Upon detection of an initiation of the power supply voltage source $V_{DD}$, the NVSRAM control circuit 555 activates the write nonvolatile element to SRAM control line 559. Since the write scheme of the NVSRAM array 500 uses a Fowler-Nordheim channel-program that consumes only 10 pA per cell, high-density of SRAM cells can be written into the same density of flash without a large high voltage charge pump 530 simultaneousely. For example, writing 8 Mb SRAM cells into 8 Mb nonvolatile memory elements for an NVSRAM array 500 of this invention only consumes 80 μA in a 300 μS time period.

Figure 7:
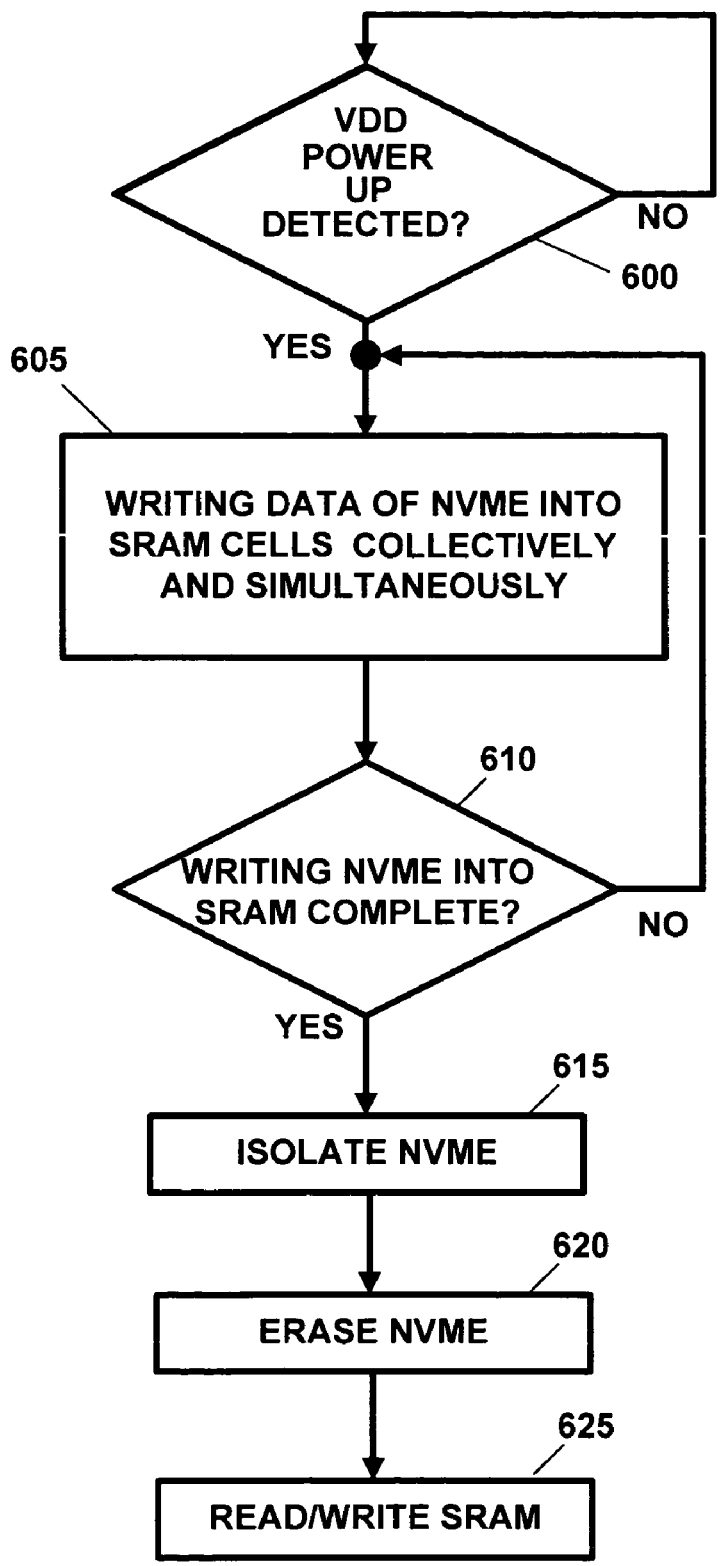
FIG. 7 is flow chart of the nonvolatile static random access memory circuit of this invention upon detection of the power initiation.
Figure 8:
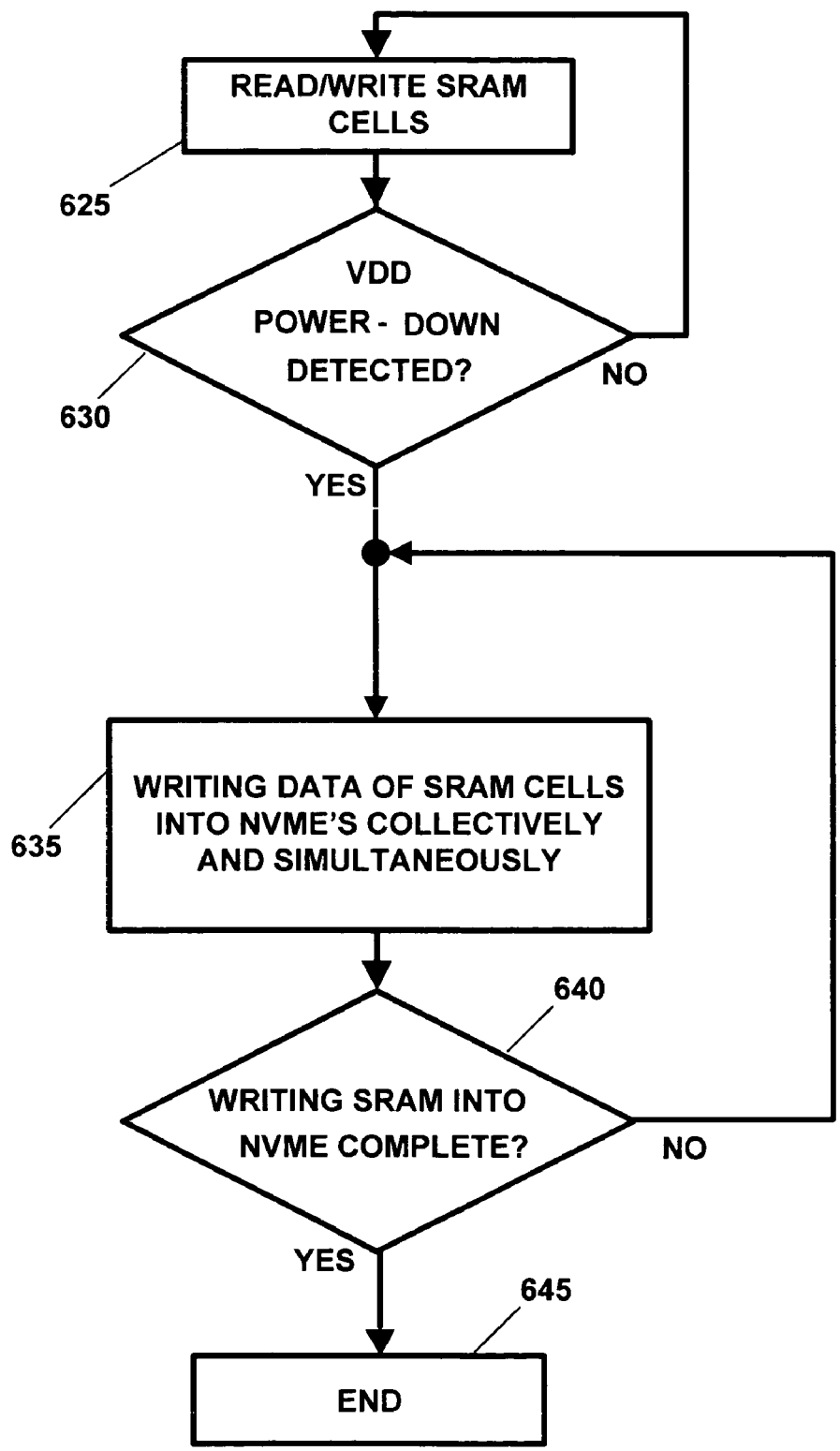
FIG. 8 is flow chart operation of the nonvolatile static random access memory circuit of this invention upon detection of the power interruption.

Refer now to FIGS. 7 and 8 for the operation of the NVSRAM array. The power up/down detection circuit 550 monitors (Box 600) the power supply voltage source $V_{DD}$ applied to the array 500 of NVSRAM's 505*a*, ..., 505*m*, 505*n*, ..., 505*z*. Upon detection of initiation, as shown in FIG. 7, of the power supply voltage source, the power supply state signal is interpreted and the NVSRAM control circuit transfers the write NVME to SRAM signal 559 to the NVRAM word line decoder 525, the select gating controller 535, and source line driver 540 to initiate the writing of the digital signals retained the nonvolatile memory element of each of the NVSRAM's 505*a*, ..., 505*m*, 505*n*, ..., 505*z* to the SRAM cell of each of the NVSRAM's 505*a*, ..., 505*m*, 505*n*, ..., 505*z*. The select gating control circuit 535 sets the first and second gating signal lines SG01 537*a*, ..., SGk1 537*z* and SG02 538*a*, ..., SGk2 538*z* to the voltage level of the power supply voltage source to activate the first and second select gating transistors of the nonvolatile memory elements of the NVSRAM's 505*a*, ..., 505*m*, 505*n*, ..., 505*z*. At the same time, the NVRAM word line decoder 525 sets the floating gate word lines FWL0 527*a*, ..., FWLk 527*z* and thus to the control gates of the floating gate transistors of the nonvolatile memory elements of the NVSRAM's 505*a*, ..., 505*m*, 505*n*, ..., 505*z* to the voltage level of the power supply voltage source $V_{DD}$ to turn on the floating gate transistors dependent upon the threshold voltage set during the programming. The digital signals representing the binary data retained by the nonvolatile memory elements of the NVSRAM's 505*a*, 505*m*, 505*m*, ..., 505*z* NVSRAM's 505*a*, ..., 505*m*, 505*n*, ..., 505*z* are then written (Box 605) collectively and simultaneously to the storage nodes of the SRAM cells of the NVSRAM's 505*a*, ..., 505*m*, 505*n*, ..., 505*z*. The NVSRAM control circuit monitors (Box 610) the state of the SRAM cells of the NVSRAM's 505*a*, ..., 505*m*, 505*n*, ..., 505*z* for completion of the writing of the data. Upon completion of the writing of the data, the select gating control circuit 535 sets the first gating signal lines SG01 537*a*, ..., SGk1 537*z* to the ground reference voltage level to deactivate the first select gating transistors of the nonvolatile memory elements of the NVSRAM's 505*a*, ..., 505*m*, 505*n*, ..., 505*z*. This isolates (Box 615) the SRAM cells from the nonvolatile memory elements of the NVSRAM's 505*a*, ..., 505*m*, 505*n*, ..., 505*z*.

The nonvolatile memory elements are then erased (Box 620) the nonvolatile memory elements of the NVSRAM's 505*a*, ..., 505*m*, 505*n*, ..., 505*z*. To erase (Box 620) the nonvolatile memory elements NVSRAM's 505*a*, ..., 505*m*, 505*n*, ..., 505*z*. The bit line BL 425 and the complementary bit line $\overline{BL}$ 430, the SRAM word lines SWL0 522*a*, ... SWLk 522*z*, and the storage node Q 408 and the complementary storage node $\overline{Q}$ 409 do not affect the voltage levels of the NVSRAM's 505*a*, ..., 505*m*, 505*n*, ..., 505*z* are therefore considered a "do not care" levels. The select gating control circuit 535 sets the second gating signal lines SG02 538*a*, ..., SGk2 538*z* to the voltage level of the power supply voltage source to activate the second select gating transistors of the nonvolatile memory elements of the NVSRAM's 505*a*, ..., 505*m*, 505*n*, ..., 505*z*. The NVRAM word line controller 525 sets the floating gate word lines FWL0 527*a*, ..., FWLk 527*z* and thus to the control gates of the floating gate transistors of the nonvolatile memory elements of the NVSRAM's 505*a*, ..., 505*m*, 505*n*, ..., 505*z* to the relatively large positive voltage of from approximately +15V to approximately +22V (preferably +18V). The source line driver 540 sets the floating gate source lines SL0 542*a*, ..., SLk 542*z* to the sources of the second select gating transistors of the nonvolatile memory elements of the NVSRAM's 505a, ..., 505m, 505n, ..., 505z to the ground reference voltage level to collectively and simultaneously erase (Box 620) the nonvolatile memory of the NVSRAM's 505a, ..., 505m, 505n, ..., 505z.

The SRAM cells of the NVSRAM's 505a, ..., 505m, 505n, ..., 505z are then selectively read from or written to (Box 625). In the read operation, the bit line BL 510a, ..., 510z and the complementary bit line $\overline{BL}$ 512a, ..., 512z is precharged or equalized to the voltage levels necessary to sense the digital signals representing the binary data to be stored retained by the SRAM cells of the NVSRAM's 505a, ..., 505m, 505n, ..., 505z. The SRAM word line decoder 520 sets the SRAM word lines SWL0 522a, ... SWLk 522z to the level of the power supply voltage source $V_{DD}$ to activate the access transistors of the SRAM cells of the NVSRAM's 505a, ..., 505m, 505n, ..., 505z. The voltage levels of the digital signals of the storage nodes and the complementary storage nodes of the SRAM cells of the NVSRAM's 505a, ..., 505m, 505n, ..., 505z are respectively transferred to be sensed by the bit line sense amplifier 515.

In write operation of the SRAM cells of the NVSRAM's 505a, ..., 505m, 505n, ..., 505z, the bit lines BL 510a, ..., 510z and the complementary bit lines $\overline{BL}$ 512a, ..., 512z are precharged to the voltage levels (VDD/0V) of the digital signals representing the binary data to be stored retained by the SRAM cells of the NVSRAM's 505a, ..., 505m, 505n, ..., 505z. The SRAM word line decoder 520 sets the SRAM word lines SWL0 522a, ..., SWLk 522z to the level of the power supply voltage source $V_{DD}$ to activate the access transistors of the SRAM cells of the NVSRAM's 505a, ..., 505m, 505n, ..., 505z. The voltage levels of the digital signals of the bit line BL 510a, ..., 510z and the complementary bit line $\overline{BL}$ 512a, ..., 512z are transferred to the storage nodes and the complementary storage node of the SRAM cells of the NVSRAM's 505a, ..., 505m, 505n, ..., 505z.

In the instance that the array 500 of the NVSRAM's 505a, ..., 505m, 505n, ..., 505z have the power supply voltage source $V_{DD}$ applied for the first time upon fabrication of the array 500, the state digital data signals within the SRAM cells and the NVME's of the NVSRAM's 505a, ..., 505m, 505n, ..., 505z are not known. The writing of the digital signals from the nonvolatile memory elements of the NVSRAM's 505a, ..., 505m, 505n, ..., 505z to the SRAM cells of the NVSRAM's 505a, ..., 505m, 505n, ..., 505z is inhibited. The select gating control circuit 535 sets the first gating signal lines SG01 537a, ..., SGk1 537z and SG02 538a, ..., SGk2 538z to the ground reference voltage level to deactivate the first select gating transistors of the nonvolatile memory elements of the NVSRAM's 505a, ..., 505m, 505n, ... 505z to prevent the digital signals from the nonvolatile memory elements of the NVSRAM's 505a, ..., 505m, 505n, ..., 505z from being written to the SRAM cells of the nonvolatile memory elements of the NVSRAM's 505a, ..., 505m, 505n, ..., 505z. Once the virgin NVSRAM die has been initiated after this first initiation, the function of the NVSRAM's 505a, ..., 505m, 505n, ..., 505z is as described above.

Refer now to FIG. 8 for a discussion of the transfer of the digital signals representing the binary data from the SRAM cells to the nonvolatile memory elements of the NVSRAM's 505a, ..., 505m, 505n, ..., 505z. During the selective reading or writing (Box 625) of the SRAM cells of the NVSRAM's 505a, ..., 505m, 505n, ..., 505z, the power up/down detection circuit 550 monitors (Box 630) the power supply voltage source $V_{DD}$. Upon detection of an interruption of the power supply voltage source $V_{DD}$, the power up/down detection circuit 550 transfers the power supply state signal to the NVSRAM control circuit 555 indicating the interruption. The NVSRAM control circuit 555 then activates the write SRAM to NVME control line 557 to perform the writing (Box 635) of the digital signals from the SRAM cells to the nonvolatile memory elements of the NVSRAM's 505a, ..., 505m, 505n, ..., 505z. The NVRAM word line decoder 525 transfers the relatively large positive voltage of from approximately +15V to approximately +22V (preferably +18V) to floating gate word lines FWL0 527a, ..., FWLk 527z and thus to the control gates of the floating gate transistors of the nonvolatile memory elements of the NVSRAM's 505a, ..., 505m, 505n, ..., 505z. The select gating control circuit 535 sets the first and second gating signal lines SG01 537a, ..., SGk1 537z and SG02 538a, ..., SGk2 538z to the voltage level of the power supply voltage source $V_{DD}$ to activate the first and second select gating transistors of the nonvolatile memory elements of the NVSRAM's 505a, ..., 505m, 505n, ..., 505z. The source line driver 540 sets the floating gate source lines SL0 542a, ..., SLk 542z to the voltage level of the power supply voltage source $V_{DD}$ and thus to the sources of the second select gating transistors of the nonvolatile memory elements of the NVSRAM's 505a, ..., 505m, 505n, ..., 505z for the transfer of the digital data signals to the storage nodes of the SRAM cells of the NVSRAM's 505a, ..., 505m, 505n, ..., 505z.

The NVSRAM control circuit 555 monitors (Box 640) the state of the writing of the digital signals from the SRAM cells to the nonvolatile memory elements of the NVSRAM's 505a, ..., 505m, 505n, ..., 505z. Upon completion of the programming of the nonvolatile memory elements of the NVSRAM's 505a, ..., 505m, 505n, ..., 505z, the process ends and the memory array 500 retains the digital signals that were present in the SRAM cells of the NVSRAM's 505a, ..., 505m, 505n, ..., 505z at the interruption of the power supply voltage source $V_{DD}$.

Figure 9:
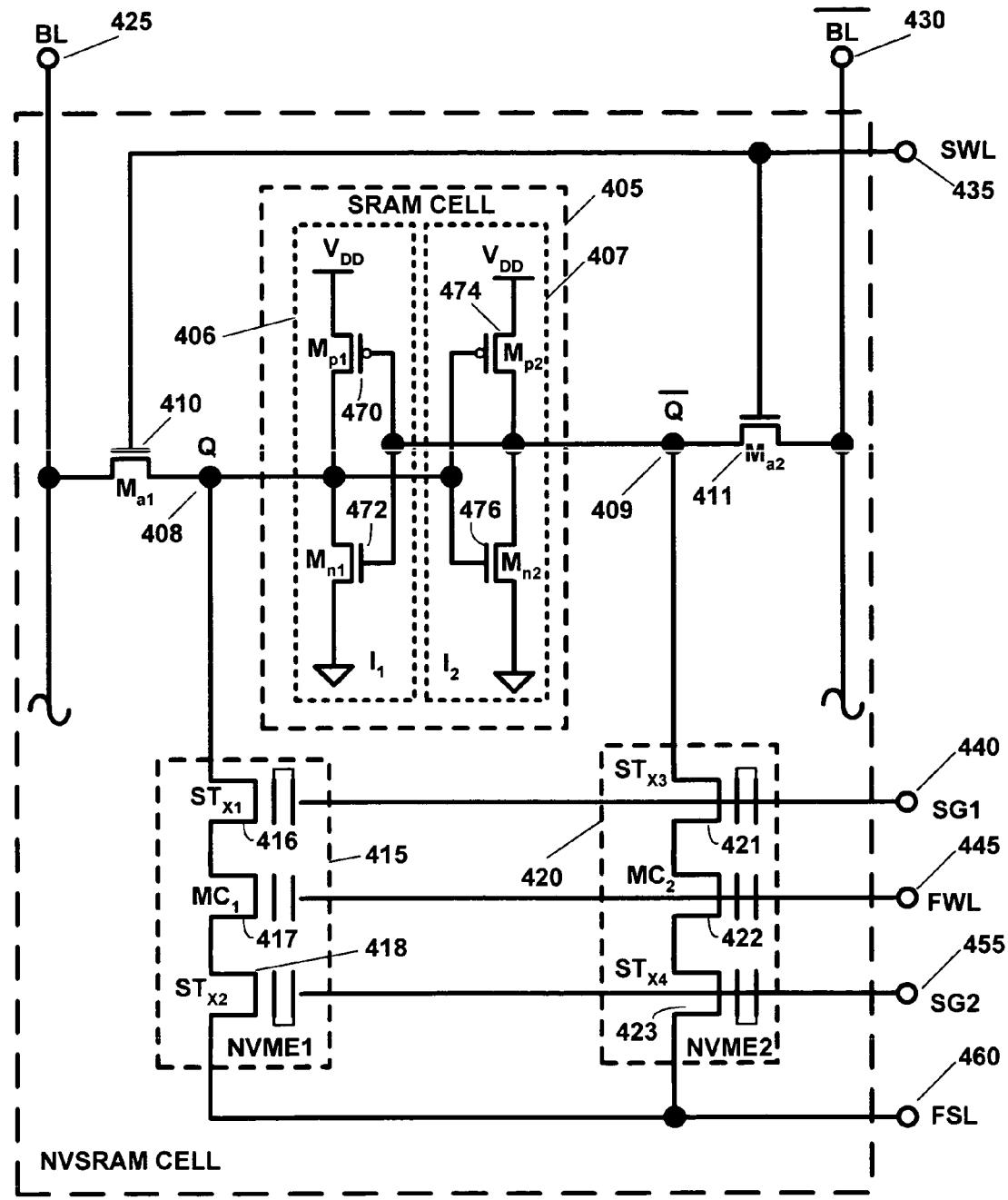
FIG. 9 is a schematic diagram of a nonvolatile static random access memory circuit of this invention.

Refer to FIG. 9 for a discussion of the operation of the NVSRAM during the transfer of the digital signals representing the binary data from the nonvolatile memory elements 415 and 420 to the SRAM cell 405. The structure and function of the NVSRAM is as described in FIG. 4 with the added detail of the inverters $I_1$ and $I_2$. The inverters $I_1$ and $I_2$ respectively have the MOS transistor pairs $M_{p1}$ 470 and $M_{n1}$ 472 and $M_{p2}$ 474 and $M_{n2}$ 476, which are each configured as a CMOS inverter as shown in FIG. 1. When power up/down detection circuit 550 detects power supply voltage source $V_{DD}$ ramping up with a rate more than 300 µS as described above, the NVSRAM control circuit 555 generates the appropriate control signals to automatically initiate a programming operation to write the complementary digital signals from the nonvolatile memory elements 415 and 420 into SRAM cell 405. One of the signals generated by the NVSRAM control circuit 555 provides the timing control signal with a time interval of more than 300 µS. The SRAM word lines SWL 435 is set to the ground reference voltage level deactivate the access transistors $Ma_1$ 410 and $Ma_2$ 411 to isolate the bit line BL 425 and the complementary bit line $\overline{BL}$ 430 from the SRAM cell 405.

The first and second gating signal terminals SG1 440 and SG2 455 are set to the power supply voltage source are set to activate the first gating transistors $ST_{x1}$ 416 and $ST_{x3}$ 421 and the second gating transistors $ST_{x2}$ 418 and $ST_{x4}$ 423. The floating gate word line FWL 445 is and the floating gate source line FSL 460 are set to the power supply voltage source $V_{DD}$ to activate the floating gate transistors $MC_1$ 417 and $MC_2$ 422.

To illustrate this operation, the nonvolatile memory element 415 is programmed with a digital signal representing the binary digit "0". The digital signal for binary digit "0" sets the threshold voltage $V_t$ of the nonvolatile memory element 415 to approximately −3V. Similarly the nonvolatile memory element 420 is programmed with a digital signal representing the binary digit "1". The digital signal for binary digit "1" sets the threshold voltage $V_t$ of the nonvolatile memory element 415 to approximately +3V. Under these initial nonvolatile memory element data conditions, the voltage level of power supply voltage source $V_{DD}$ present at the floating gate source line FSL 460 will pass through the nonvolatile memory element 415 to the storage node Q 408. The voltage level to the storage node Q 408 is forced to the voltage level of the power supply voltage source $V_{DD}$ less the threshold voltage $V_t$ level ($V_{DD}-V_t$) where the threshold voltage $V_t$ is around 0.7V and is the threshold voltage of STx1 or STx2 with body effect. The MOS transistors $M_{n2}$ 476 is turned on and the MOS transistor $M_{p2}$ is turned off. The threshold voltage $V_t$ of the nonvolatile memory element 420 being set to approximately +3V causes the complementary storage node $\overline{Q}$ 409 to be determined by the state of the MOS transistors $M_{n2}$ 476 and the MOS transistor $M_{p2}$ 474. Since the MOS transistors $M_{n2}$ 476 is turned on the complementary storage node $\overline{Q}$ 409 is set essentially to the ground reference voltage level. This forces the MOS transistor $M_{n1}$ 472 to turn off and the MOS transistor $M_{p2}$ 470 to turn on thus latching the data into the SRAM memory cell.

In regular power-up operation, all the nonvolatile memory elements that retain the last digital data from the last power interruption will be written into SRAM cells with the pattern as described above simultaneousely. Unlike the regular SRAM which only allows the writing in units of bytes of words, the writing of digital data signals from nonvolatile memory elements into SRAM cells is done in whole chip collectively. In other words, if whole chip contains 8 Mb SRAM cells and nonvolatile memory elements, the writing of digital data signals from nonvolatile memory elements into SRAM is in units of 8 Mb during power-up may be divided into several sectors. The NVSRAM control circuit 555 can be organized to write flash cells into SRAM cells sector by sector within a predetermined allowed time can be designed.

When power up/down detection circuit 550 detects that the voltage level of the power supply voltage source $V_{DD}$ has decrease by more than 0.3V from it operating level, the NVSRAM control circuit 555 generates the appropriate control signals to automatically initiate a programming operation to write the digital signals from all SRAM cells 405 into whole nonvolatile memory elements 415 and 420. The relatively large positive voltage of from approximately +15V to approximately +22V (preferably +18V) allowing the Fowler-Nordheim tunneling effect is required to program the nonvolatile memory elements 415 and 420. As explained in FIG. 4, the nonvolatile memory elements 415 and 420 require the relatively large positive voltage at the control gates and the ground reference voltage (0V) presented to the source and drain nodes for the Fowler-Nordheim channel program operation. For successful Fowler-Nordheim channel program, typically a time of more than 300 μS time is required. Since Fowler-Nordheim channel program only consumes 10 pA per nonvolatile memory element, the whole chip of 8 Mb NVSRAM cells would consume only consumes 80 μA for programming. One of the signals generated by the NVSRAM control circuit 555 provides the timing control signal with a time interval of more than 300 μS. The SRAM word lines SWL 435 is set to the ground reference voltage level deactivate the access transistors $Ma_1$ 410 and $Ma_2$ 411 to isolate the bit line BL 425 and the complementary bit line $\overline{BL}$ 430 from the SRAM cell 405.

The first and second gating signal terminals SG1 440 and SG2 455 are set to the power supply voltage and ground voltage source respectively are set to activate the first gating transistors $ST_{x1}$ 416 and $ST_{x3}$ 421 and deactivate the second gating transistors $ST_{x2}$ 418 and $ST_{x4}$ 423. The floating gate word line FWL 445 is set to the relatively high positive programming voltage (on the order of from approximately +15.0 to approximately +22.0V) to activate the floating gate transistors $MC_1$ 417 and $MC_2$ 422 for programming. The floating gate source line FSL 460 is set to the ground reference voltage level or $V_{DD}$ power supply voltage level to prevent the leakage of the floating gate transistors $MC_1$ 417 and $MC_2$ 422 during program operation.

To illustrate the programming of the nonvolatile memory elements 415 and 420, the storage node Q 408 is set to the voltage level of the digital signal representing the binary digit "0" (the ground reference voltage level). The complementary storage node $\overline{Q}$ 409 is set the voltage level of the digital signal representing the binary digit "1" (the voltage level of the power supply voltage source $V_{DD}$). With the voltage of the storage node Q 408 the voltage in the channel of the floating gate transistor $MC_1$ 417 becomes the ground reference voltage level (0V). With the voltage of the complementary storage node $\overline{Q}$ 409 at the voltage level of the binary digit "1" and second gating transistors $ST_{x2}$ 418 and $ST_{x4}$ 423 in non-conduction state, the channel of floating gate transistor $MC_2$ 422 is becomes the voltage level of the power supply voltage source $V_{DD}$ less a threshold voltage level ($V_t$) initially. As floating gate word line FWL 445 and thus the gate of the floating gate transistors $MC_1$ 417 and $MC_2$ 422 is ramped to the relatively high positive programming voltage (on the order of from approximately +15.0 to approximately +22.0V), the channel of floating gate transistor 417 still remains at the ground voltage level, thus the Fowler-Nordheim tunneling will happen to first floating gate transistors $MC_1$ 417. The channel voltage of floating gate transistor of second floating gate transistor $MC_2$ 422 will ramp from voltage level of the power supply voltage source $V_{DD}$ less a threshold voltage level ($V_t$) to the relatively high positive programming voltage of 5.0V to 9.0V depending on the coupling ratio of the floating gate transistor $MC_2$ 422, which will prohibit the Fowler-Nordheim channel tunneling on the floating gate transistor $MC_2$ 422. The reason of Fowler-Nordheim tunneling is prohibited due to the low voltage drop between control gate and the channel of around 9V. This assumes a 50% coupling from the control gate and channel of the floating gate transistor $MC_2$ 422 (more than 5V due to gate coupling effect) of floating gate qjtransistor $MC_2$ 422. In the floating gate transistor $MC_1$ 417, the channel voltage is maintained at ground reference voltage level and the voltage between floating gate and channel is more than Fowler-Nordheim-tunneling voltage. Therefore, the floating gate transistor's $MC_1$ 417 threshold voltage $V_t$ is increased to around +3V and floating gate transistor's $MC_2$ 422 threshold voltage $V_t$ is kept to its erased threshold voltage $V_t$ of around −3V. As explained above, the whole 8 Mb SRAM cells' data can be written into 8 Mb flash cells simultaneously and collectively.

While this invention has been particularly shown and described with reference to the preferred embodiments thereof, it will be understood by those skilled in the art that various changes in form and details may be made without departing from the spirit and scope of the invention.

The invention claimed is:

1. An integrated nonvolatile static random access memory circuit formed on a substrate, said integrated nonvolatile static random access memory circuit comprising:
    a static random access memory cell comprising:
        a latched memory element to retain a digital signal indicative of a data bit, and
        a first access transistor and a second access transistor connected to allow control access of a first bit line and a second bit line to said latched memory element for writing and reading said digital signal to and from said latched memory element,
        said first and second access transistors having control gates in communication with a word line for controlling access of said latched memory element to said first and second bit lines;
    a first nonvolatile memory element in communication with said latched memory element through a first terminal to receive and permanently retain said digital signal from said latched memory element; and
    a second nonvolatile memory element in communication with said latched memory element through a first terminal to receive and permanently retain a complementary level of said digital signal from said latched memory element;
    wherein said first nonvolatile memory element and said second nonvolatile memory element are stacked gate nonvolatile memory elements that have a relatively small coupling ratio of capacitance formed by a control gate placed over a floating gate to a total capacitance of said floating gate and said control gate, such that said control gate of said first nonvolatile memory element and said second nonvolatile memory element require a program signal is from approximately +15V to approximately +22V for programming and a erase signal from approximately −15V to approximately −22V for erasing.

2. The integrated nonvolatile static random access memory circuit of claim 1 wherein said first terminal of said first nonvolatile memory element is connected to a storage node between the first access transistor and the latched memory element to transfer said digital signal to said first nonvolatile memory element.

3. The integrated nonvolatile static random access memory circuit of claim 1 wherein said first terminal of said second nonvolatile memory element is connected to a complementary storage node between the second access transistor and the latched memory element to transfer said digital signal to said second nonvolatile memory element.

4. The integrated nonvolatile static random access memory circuit of claim 1 wherein said first and second nonvolatile memory elements are comprised of:
    a first select gating transistor including a drain connected to the first terminal and a gate connected to receive a first select gating signal;
    a floating gate transistor having a drain connected to a source of said first gating transistor such that when said first select gating signal is activated said drain of said floating gate is connected to said latched memory element and a gate connected to receive a read, program, and erase signals for said floating gate transistor; and
    a second select gating transistor including a drain connected to a source of said floating gate transistor, a source connected to receive a source line signal for reading, programming, and erasing said floating gate transistor, and a gate to receive a second select gating signal for connecting said source line signal to said source of said floating gate transistor.

5. The integrated nonvolatile static random access memory circuit of claim 4 wherein said static random access memory cell retains said digital signal as volatile digital data by setting the first gating signal such that the first select gating transistors of the first and second nonvolatile memory elements are deactivated and said static random access memory cell is effectively not in communication with said first and second nonvolatile memory elements.

6. The integrated nonvolatile static random access memory circuit of claim 4 wherein said first and second nonvolatile memory elements are erased by the steps of:
    setting said first gating select signal to deactivate said first select gating transistors of said first and second nonvolatile memory elements;
    applying said erase signal to said gate of said floating gate transistors of said first and second nonvolatile memory elements;
    applying said second gating select signal to activate said select gating transistor of said first and second nonvolatile memory elements to connect said sources of said floating gate transistors of said first and second nonvolatile memory elements to said source line; and
    applying a ground reference voltage to said source line.

7. The integrated nonvolatile static random access memory circuit of claim 4 wherein said digital signal is programmed to said first nonvolatile memory element and the complementary of said digital signal are programmed to said second nonvolatile memory element by the steps of:
    setting said first gating select signal to activate said first select gating transistors of said first and second nonvolatile memory elements;
    applying said program signal to said gate of said floating gate transistors of said first and second nonvolatile memory elements;
    applying said second gating select signal to activate said select gating transistors of said first and second nonvolatile memory elements to connect said sources of said floating gate transistors of said first and second nonvolatile memory elements to said source line; and
    applying a ground reference voltage to said source line.

8. A nonvolatile static random access memory array comprising:
    a plurality of integrated nonvolatile static random access memory circuits arrange in an array of rows and columns and formed on a substrate, said integrated nonvolatile static random access memory circuit comprising:
        a static random access memory cell comprising:
            a latched memory element to retain a digital signal indicative of a data bit, and
            a first access transistor and a second access transistor connected to allow control access of a first bit line and a second bit line to said latched memory element for writing and reading said digital signal to and from said latched memory element,
            said first and second access transistors having control gates in communication with a word line for controlling access of said latched memory element to said first and second bit lines;
        a first nonvolatile memory element in communication with said latched memory element through a first terminal to receive and permanently retain said digital signal from said latched memory element; and a second nonvolatile memory element in communication with said latched memory element through a first terminal to receive and permanently retain a complementary level of said digital signal from said latched memory element;

wherein said first nonvolatile memory element and said second nonvolatile memory element are stacked gate nonvolatile memory elements that have a relatively small coupling ratio of capacitance formed by a control gate placed over a floating gate to a total capacitance of said floating gate and said control gate, such that said control gate of said first nonvolatile memory element and said second nonvolatile memory element require a program signal is from approximately +15V to approximately +22V for programming and a erase signal from approximately −15V to approximately −22V for erasing.

9. The nonvolatile static random access memory array of claim 8 further comprising a power detection circuit in communication with the plurality of integrated nonvolatile static random access memory circuits to detect a power interruption and a power initiation and communicate said detection of said power interruption and detection of said power initiation to said plurality of integrated nonvolatile static random access memory circuits.

10. The nonvolatile static random access memory array of claim 9 wherein, said static random access memory cell of each of the nonvolatile static random access memories upon detection of said power interruption, transmits said digital signal and a complementary of said digital signal to said first and second nonvolatile memory elements.

11. The nonvolatile static random access memory array of claim 9 wherein, said static random access memory cell of each of the nonvolatile static random access memories upon detection of said power initiation, receives said digital signal and a complementary of said digital signal from said first and second nonvolatile memory elements.

12. The nonvolatile static random access memory array of claim 8 wherein said first terminal of said first nonvolatile memory element of each of the plurality of integrated nonvolatile static random access memory circuits is connected to a storage node between the first access transistor and the latched memory element to transfer said digital signal to said first nonvolatile memory element.

13. The nonvolatile static random access memory array of claim 8 wherein said first terminal of said second nonvolatile memory element of each of the plurality of integrated nonvolatile static random access memory circuits is connected to a complementary storage node between the second access transistor and the latched memory element to transfer said digital signal to said second nonvolatile memory element.

14. The nonvolatile static random access memory array of claim 8 wherein said first and second nonvolatile memory elements of each of the plurality of integrated nonvolatile static random access memory circuits are comprised of:

a first select gating transistor including a drain connected to the first terminal and a gate connected to receive a first select gating signal;

a floating gate transistor having a drain connected to a source of said first gating transistor such that when said first select gating signal is activated said drain of said floating gate is connected to said latched memory element and a gate connected to receive a read, program, and erase signals for said floating gate transistor; and a second select gating transistor including a drain connected to a source of said floating gate transistor, a source connected to receive a source line signal for reading, programming, and erasing said floating gate transistor, and a gate to receive a second select gating signal for connecting said source line signal to said source of said floating gate transistor.

15. The nonvolatile static random access memory array of claim 11 wherein said static random access memory cell of each of the plurality of integrated nonvolatile static random access memory circuits retains said digital signal as volatile digital data by setting the first gating signal such that the first select gating transistors of the first and second nonvolatile memory elements are deactivated and said static random access memory cell is effectively not in communication with said first and second nonvolatile memory elements.

16. The nonvolatile static random access memory array of claim 14 wherein said first and second nonvolatile memory elements of each of the plurality of integrated nonvolatile static random access memory circuits are erased by the steps of:

setting said first gating select signal to deactivate said first select gating transistors of said first and second nonvolatile memory elements;

applying said erase signal to said gate of said floating gate transistors of said first and second nonvolatile memory elements;

applying said second gating select signal to activate said select gating transistor of said first and second nonvolatile memory elements to connect said sources of said floating gate transistors of said first and second nonvolatile memory elements to said source line; and applying a ground reference voltage to said source line.

17. The nonvolatile static random access memory array of claim 14 wherein said digital signal is programmed to said first nonvolatile memory element of each of the plurality of integrated nonvolatile static random access memory circuits and the complementary of said digital signal are programmed to said second nonvolatile memory element of each of the plurality of integrated nonvolatile static random access memory circuits by the steps of:

setting said first gating select signal to activate said first select gating transistors of said first and second nonvolatile memory elements;

applying said program signal to said gate of said floating gate transistors of said first and second nonvolatile memory elements;

applying said second gating select signal to activate said select gating transistors of said first and second nonvolatile memory elements to connect said sources of said floating gate transistors of said first and second nonvolatile memory elements to said source line; and applying a ground reference voltage to said source line.

18. A method for forming an integrated nonvolatile static random access memory circuit on a substrate comprising the steps of:

forming a static random access memory cell by the steps of:

forming a latched memory element on said substrate to retain a digital signal indicative of a data bit, forming a first access transistor and a second access transistor on said substrate, connecting said first and second access transistors to allow control access of a first bit line and a second bit line to said latched memory element for writing and reading said digital signal to and from said latched memory element, and connecting control gates of said first and second access transistors having control gates to be in communication with a word line for controlling access of said latched memory element to said first and second bit lines;

forming a first nonvolatile memory element on said substrate;

placing said first nonvolatile memory element in communication with said latched memory element through a first terminal to receive and permanently retain said digital signal from said latched memory element;

forming a second nonvolatile memory element; and placing said second nonvolatile memory element in communication with said latched memory element through a first terminal to receive and permanently retain a complementary level of said digital signal from said latched memory element;

wherein forming said first nonvolatile memory element and forming said second nonvolatile memory element each comprise the step of stacking said control gate over said floating gate such that said first nonvolatile memory element and said second nonvolatile memory element have relatively small coupling ratio of capacitance formed by said control gate placed over said floating gate to a total capacitance of said floating gate and said control gate, such that said control gate of said first nonvolatile memory element and said second nonvolatile memory element require a program signal is from approximately +15V to approximately +22V for programming and a erase signal from approximately −15V to approximately −22V for erasing.

19. The method for forming the integrated nonvolatile static random access memory circuit of claim 18 further comprising the step of connecting said first terminal of said first nonvolatile memory element to a storage node between the first access transistor and the latched memory element to transfer said digital signal to said first nonvolatile memory element.

20. The method for forming the integrated nonvolatile static random access memory circuit of claim 18 further comprising the step of connecting said first terminal of said second nonvolatile memory element to a complementary storage node between the second access transistor and the latched memory element to transfer said digital signal to said second nonvolatile memory element.

21. The method for forming the integrated nonvolatile static random access memory circuit of claim 18 wherein forming said first and second nonvolatile memory elements on said substrate comprise the steps of:

forming a first select gating transistor including a drain connected to the first terminal and a gate connected to receive a first select gating signal;

forming a floating gate transistor having a drain connected to a source of said first gating transistor such that when said first select gating signal is activated said drain of said floating gate is connected to said latched memory element and a gate connected to receive a read, program, and erase signals for said floating gate transistor; and forming a second select gating transistor including a drain connected to a source of said floating gate transistor, a source connected to receive a source line signal for reading, programming, and erasing said floating gate transistor, and a gate to receive a second select gating signal for connecting said source line signal to said source of said floating gate transistor.

22. The method for forming the integrated nonvolatile static random access memory circuit of claim 21 wherein said static random access memory cell retains said digital signal as volatile digital data by setting the first gating signal such that the first select gating transistors of the first and second nonvolatile memory elements are deactivated and said static random access memory cell is effectively not in communication with said first and second nonvolatile memory elements.

23. The method for forming the integrated nonvolatile static random access memory circuit of claim 21 wherein said first and second nonvolatile memory elements are erased by the steps of:

setting said first gating select signal to deactivate said first select gating transistors of said first and second nonvolatile memory elements;

applying said erase signal to said gate of said floating gate transistors of said first and second nonvolatile memory elements;

applying said second gating select signal to activate said select gating transistor of said first and second nonvolatile memory elements to connect said sources of said floating gate transistors of said first and second nonvolatile memory elements to said source line; and applying a ground reference voltage to said source line.

24. The method for forming the integrated nonvolatile static random access memory circuit of claim 21 wherein said digital signal is programmed to said first nonvolatile memory element and the complementary of said digital signal are programmed to said second nonvolatile memory element by the steps of:

setting said first gating select signal to activate said first select gating transistors of said first and second nonvolatile memory elements;

applying said program signal to said gate of said floating gate transistors of said first and second nonvolatile memory elements;

applying said second gating select signal to activate said select gating transistors of said first and second nonvolatile memory elements to connect said sources of said floating gate transistors of said first and second nonvolatile memory elements to said source line; and applying a ground reference voltage to said source line.

* * * * *